United States Patent
Liu

(10) Patent No.: US 9,899,615 B1
(45) Date of Patent: Feb. 20, 2018

(54) MANUFACTURING METHOD AND APPARATUS OF ORGANIC THIN FILM TRANSISTOR

(71) Applicant: Wuhan China Star Optoelectronics Technology Co., Ltd., Wuhan, Hubei (CN)

(72) Inventor: Zhe Liu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 26 days.

(21) Appl. No.: 15/126,488

(22) PCT Filed: Aug. 3, 2016

(86) PCT No.: PCT/CN2016/093077
§ 371 (c)(1),
(2) Date: Sep. 15, 2016

(51) Int. Cl.
| | |
|---|---|
| *B41F 31/28* | (2006.01) |
| *B41F 17/00* | (2006.01) |
| *B41M 3/00* | (2006.01) |
| *H01L 51/05* | (2006.01) |

(52) U.S. Cl.
CPC .......... *H01L 51/0541* (2013.01); *B41F 17/00* (2013.01); *B41F 31/28* (2013.01); *B41M 3/006* (2013.01); *H01L 51/052* (2013.01); *H01L 51/0558* (2013.01)

(58) Field of Classification Search
None
See application file for complete search history.

(56) References Cited

U.S. PATENT DOCUMENTS

| | | | | |
|---|---|---|---|---|
| 2004/0115344 | A1* | 6/2004 | Newsome | B41J 3/407 427/162 |
| 2005/0253915 | A1* | 11/2005 | Matsumoto | B41J 3/543 347/104 |
| 2007/0013765 | A1* | 1/2007 | Hudson | B41J 2/45 347/238 |

FOREIGN PATENT DOCUMENTS

| | | |
|---|---|---|
| CN | 1139223 A | 1/1997 |
| CN | 1713407 A | 12/2005 |
| JP | 2004048030 A | 2/2004 |

* cited by examiner

*Primary Examiner* — Joseph Schoenholtz
(74) *Attorney, Agent, or Firm* — Andrew C. Cheng

(57) ABSTRACT

A manufacturing method of an organic thin film transistor includes: forming source and drain electrodes on a substrate; irradiating a photosensitive outer surface with a first charge of a photosensitive roller by laser to pattern the photosensitive outer surface and forming a channel pattern area without charge; spraying an atomized organic material solution with a third charge having same polarity as the first charge onto the channel pattern area to make the organic material solution be absorbed onto the channel pattern area and thereby form a channel region layer; attaching a fourth charge having an opposite polarity to the third charge onto a surface of the substrate disposed with the source and drain electrodes; and transferring a channel pattern in the channel region layer onto the substrate and connected with the source and drain electrodes and thereby forming a channel region. A manufacturing apparatus also is provided.

12 Claims, 5 Drawing Sheets

MANUFACTURING METHOD AND APPARATUS OF ORGANIC THIN FILM TRANSISTOR

CROSS REFERENCE TO RELATED APPLICATION

This application claims the priority of Chinese Patent Application No. 201610548174.0, entitled "Manufacturing Method and Apparatus Of Organic Thin Film Transistor", filed on Jul. 12, 2016, the disclosure of which is incorporated herein by reference in its entirety.

FIELD OF THE INVENTION

The invention relates to the field of display panel manufacturing technology, and particularly to a manufacturing method and a manufacturing apparatus of an organic thin film transistor.

BACKGROUND OF THE INVENTION

A thin film transistor manufactured by a solution method has gotten extensive attention owing to its advantages of low cost, low temperature prepared, easy to be flexible and integrated in large scale, and has been applied to practical applications such as sensing units, RF sign identification tags, electronic paper display backplanes and medical and health fields. Along with the increasing demands of low cost and portability of people to electronic products, the development of the thin film transistor prepared by the solution method is bound to be more and more promotion and attention.

A flexible display driving substrate based on the organic thin film transistor (OTFT) currently is still in the development stage, and the patterning of an organic conductive channel layer (organic semiconductor layer, i.e., OSC) in the OTFT usually employs an "exposure-developing-etching" process or a direct "mask-evaporation" process. However, the two processes typically require the use of high-standard vacuum evaporation and exposure equipment or a fine metal evaporation template, and therefore a variety of equipment are required, resulting in large energy consumption and increased manufacturing cost.

SUMMARY OF THE INVENTION

Accordingly, the invention provides a manufacturing method and a manufacturing apparatus of an organic thin film transistor, which are capable of efficiently manufacturing an organic layer pattern of a thin film transistor, compared with the conventional patterning method, the equipment expense can be saved and the cost is reduced.

Specifically, a manufacturing apparatus of an organic thin film transistor includes: a photosensitive roller, an exposure assembly, a developing assembly and a driven roller. The photosensitive roller includes a photosensitive outer surface with a first charge and a photosensitive inner surface with a second charge. The first charge and the second charge have opposite polarities. The exposure assembly is configured (i.e., structured and arranged) for irradiating a laser with graphic information to the photosensitive outer surface and thereby forming a pattern area without charge on the photosensitive outer surface. The developing assembly includes a pump for outputting an organic material solution and a high-pressure nozzle with an electrode pairs, the organic material solution ejected from the high-pressure nozzle in operation carries a third charge having a polarity same as that of the first charge and the ejected organic material solution is absorbed onto the pattern area. An outer circumferential surface of the driven roller and the photosensitive outer surface of the photosensitive roller are tangent and have opposite rotation directions.

In an embodiment, the manufacturing apparatus further includes a power supply assembly. The power supply assembly includes a charging electrode and a power supply for supplying the charging electrode with current.

In an embodiment, the exposure assembly includes a laser tube, a reflector group, a laser modulator and a collimating lens. The reflector group is configured for adjusting a propagation path of a laser emitted from the laser tube and making the laser enter into the laser modulator, so that the laser is modulated into the laser carried with the graphic information by a laser modulator driving pulse and then strikes onto the photosensitive outer surface after passing the collimating lens to thereby form the pattern area.

In an embodiment, the developing assembly further a reservoir of the organic material solution connected with the pump, and the organic material solution in the reservoir enters into the nozzle by the pump and then is charged and atomized for being ejected out.

In an embodiment, a surface of the driven roller is given with a fourth charge having a polarity opposite to that of the third charge, and the fourth charge is for charging a thin film transistor flexible substrate wound on the outer circumferential surface of the driven roller.

In addition, the invention provides a manufacturing method of an organic thin film transistor. The manufacturing method includes:

step one, forming a source electrode and a drain electrode on a substrate;

step two, irradiating a photosensitive outer surface with a first charge of a photosensitive roller by a laser from an exposure assembly to pattern the photosensitive outer surface and thereby forming a channel pattern area without charge on the photosensitive outer surface;

step three, spraying an atomized organic material solution carried with a third charge having a polarity same as that of the first charge onto the channel pattern area on the photosensitive outer surface of the photosensitive roller by a developing assembly, to make the organic material solution be absorbed onto the channel pattern area and thereby form a channel region layer;

step four, attaching a fourth charge having a polarity opposite to that of the third charge onto a surface of the substrate disposed with the source electrode as well as the drain electrode;

step five, transferring a channel pattern in the channel region layer on the photosensitive outer surface of the photosensitive roller onto the substrate and being connected with the source electrode and the drain electrode and thereby forming a channel region.

In an embodiment, irradiating by a laser from an exposure assembly to pattern a photosensitive outer surface carried with a first charge of a photosensitive roller and thereby forming a channel pattern area without charge on the photosensitive outer surface includes: charging the photosensitive outer surface of the photosensitive roller by a power supply assembly to make the photosensitive outer surface be uniformly carried with the first charge.

In an embodiment, irradiating by a laser from an exposure assembly to pattern a photosensitive outer surface carried with a first charge of a photosensitive roller and thereby forming a channel pattern area without charge on the photosensitive outer surface includes: irradiating the photosensitive outer surface with the first charge by the laser carried with a graphic information; wherein the first charge in an irradiated portion and a second charge inside the photosensitive roller are communicated to make the charge in the irradiated portion disappear and thereby the channel pattern area without charge is formed.

In an embodiment, spraying an atomized organic material solution carried with a third charge having a polarity same as that of the first charge onto the channel pattern area on the photosensitive outer surface of the photosensitive roller by a developing assembly to make the organic material solution be absorbed onto the channel pattern area and thereby form a channel region layer includes: using a pump and a nozzle to atomize the organic material solution, charge the organic material solution with the third charge and then spray the organic material solution onto the channel pattern area.

In an embodiment, transferring the channel region layer on the photosensitive outer surface of the photosensitive roller onto the substrate and being connected with the source electrode and the drain electrode to thereby form a channel region includes: sandwiching the substrate between the photosensitive roller and a driven roller and supporting the substrate by the driven roller and further rotating the photosensitive roller and the driven roller, and thereby the organic material solution on the channel region layer of the photosensitive outer surface is transferred onto the substrate.

In an embodiment, the manufacturing method further includes a step of forming another organic material layer of the organic thin film transistor on the substrate by the step two through the step five.

The manufacturing method of an organic thin film transistor of the invention adopts a technique similar to "Electrophotography" and its method of defining an organic layer pattern based on a solution method is using a laser beam to quickly "project" a digital pattern onto a uniformly charged surface of a photosensitive roller. A position hit by the laser beam would lead to the occurrence of charge disappearance phenomenon and thereby a pattern area as required is formed. Small droplets of atomized and charged organic material solution are absorbed onto the pattern area and then are transferred to the substrate to form a patterned channel region. Such method can define a fine organic channel region and meanwhile avoid the mutual pollution between an organic solution with an organic material and an organic photoresist. The ultimate goal is to effectively reduce the complexity of using a vacuum equipment to manufacture a layer with same function and meanwhile reduce the material cost of various layers of an organic thin film transistor substrate.

BRIEF DESCRIPTION OF THE DRAWINGS

In order to more clearly illustrate technical solutions of the invention, drawings will be used in the description of embodiments will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described.

A preferred embodiment of the invention provides a manufacturing apparatus of an organic thin film transistor, and it uses a process different from that usually employs the "exposure-developing-etching" to manufacture an organic layer of the organic thin film transistor such as a channel layer, an organic gate dielectric layer or an organic passivation layer. In the illustrated embodiment, forming a channel layer by the manufacturing apparatus of an organic thin film transistor is taken as an example for the purpose of illustration.

Figure 1:
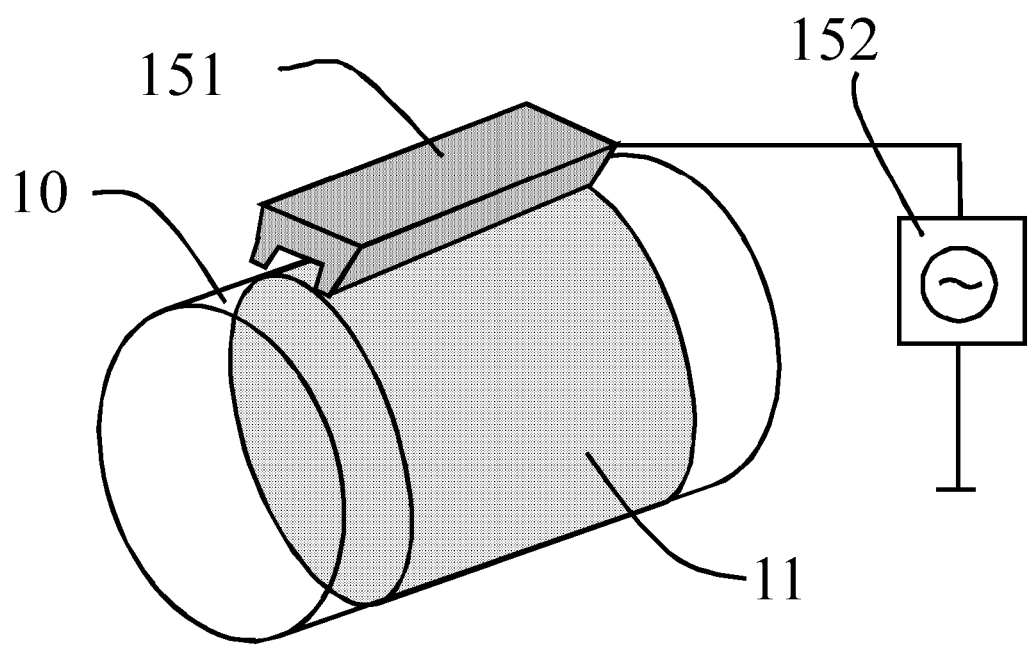
FIG. 1 is a schematic view of a photosensitive roller and a power supply assembly of a manufacturing apparatus of an organic thin film transistor according to a preferred embodiment of the invention.
Figure 2:
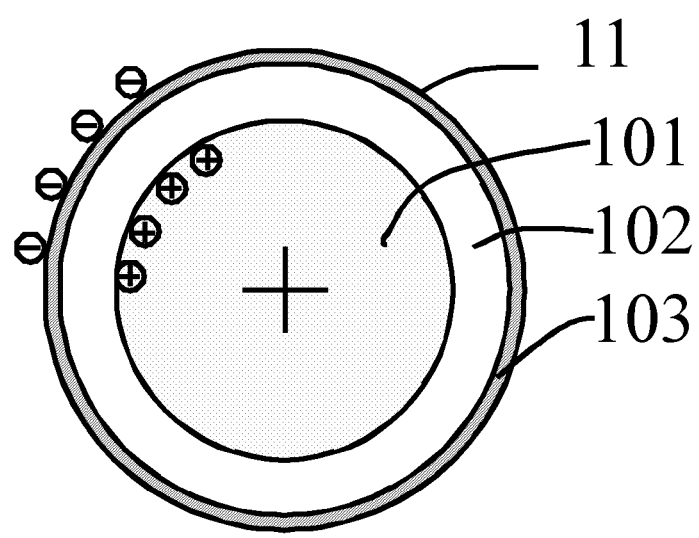
FIG. 2 is a cross-sectional view of the photosensitive roller of the manufacturing apparatus of an organic thin film transistor in FIG. 1.

Referring to FIG. 1 through FIG. 5, the apparatus includes a photosensitive roller 10, an exposure assembly 20, a developing assembly 30 and a driven roller 40. The photosensitive roller 10 includes a photosensitive outer surface 11 with a first charge and a photosensitive inner surface with a second charge. The first charge and the second charge have opposite polarities. As shown in FIG. 1 and FIG. 2, the photosensitive roller 10 is cylindrical, and from its axis to the outer surface, sequentially includes a conductive inner shaft 101, an insulating layer 102 surrounding outside of the conductive inner shaft 101, and a photosensitive layer 103 surrounding the outer surface of the insulating layer 102. The photosensitive outer surface 11 is a part of the outer surface of the photosensitive layer 103, and the first charge is uniformly attached onto the photosensitive outer surface 11. The photosensitive inner surface is located at the surface of the conductive inner shaft 101 and insulated from the photosensitive layer 103 by the insulating layer 102. In the illustrated embodiment, the first charge is a negative charge, and the second charge is a positive charge. The manufacturing apparatus further includes a power supply assembly (not labeled), and the power supply assembly includes a charging electrode 151 and a power supply 152 for supplying the charging electrode 151 with current. The charging electrode 151 is located at a side of the photosensitive roller 10 and configured (i.e., structured and arranged) to provide the photosensitive outer surface with the first charge. The charging electrode 151 generates corona discharge under the effect of the DC high-voltage power supply 152, electrically non-conductive air around the charging electrode 151 is ionized, so that the photosensitive roller 10 is uniformly charged with the first charge in a process of rotation.

Figure 3:
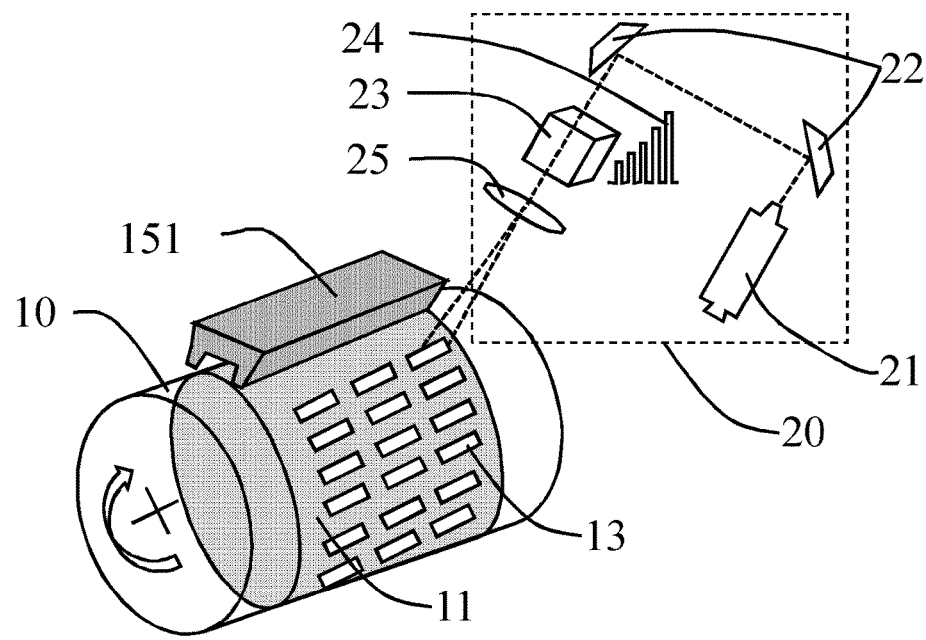
FIG. 3 is a schematic view of the photosensitive roller and an exposure assembly of the manufacturing apparatus of an organic thin film transistor in FIG. 1.

Referring to FIG. 3, the exposure assembly 20 provides a laser with graphic information to irradiate the photosensitive outer surface 11 and thereby form pattern areas 13 without charge on the photosensitive outer surface 11. In the illustrated embodiment, the exposure assembly 20 includes a laser tube 21, a reflector group 22, a laser modulator 23, a laser modulator driving pulse 24 and a collimating lens 25. The reflector group 23 adjusts a light path of the laser emitted from the laser tube 21 to make the laser enter into the laser modulator 23, then the laser is modulated into a laser with the graphic information by the laser modulator driving pulse 24 and afterwards strikes on the photosensitive outer surface 11 after passing the collimating lens 25 so as to form the pattern areas 13. In particular, the reflector group 23 includes two mirrors, one of the mirrors is disposed facing towards the laser tube 12 and for reflecting the laser from the laser tube 21 towards the other one of the mirrors, and the other one of the mirrors is disposed facing towards the laser modulator 23 and for reflecting the received laser towards the laser modulator 23. The laser modulator 23 is driven by the laser modulator driving pulse 24 and extracts the graphic information in an electrical signal for modulation to form a laser with print graphic information, the laser then strikes on the photosensitive outer surface 11 after passing through the collimating lens 25 and thereby the required pattern areas 13 are formed on the photosensitive outer surface 11

Figure 4:
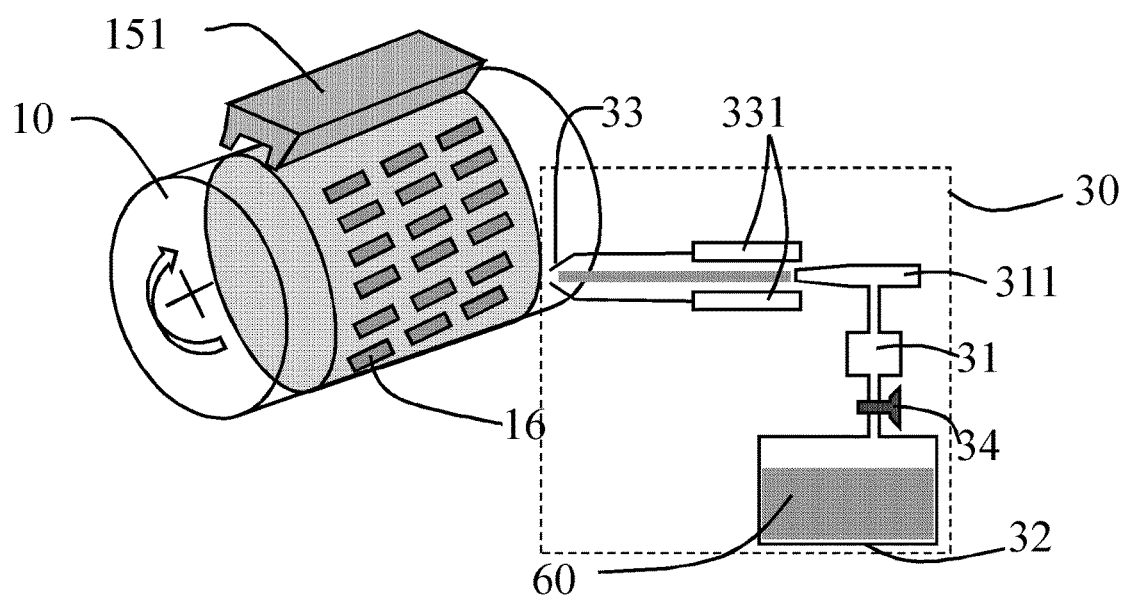
FIG. 4 is a schematic view of the photosensitive roller and a developing assembly of the manufacturing apparatus of an organic thin film transistor in FIG. 1.

Referring to FIG. 4, the developing assembly 30 includes a pump 31 for outputting an organic material solution and a high-pressure nozzle 33 with an electrode pair 331. The organic material solution ejected from the high-pressure nozzle 33 carries a third charge with a polarity same as that of the first charge, and the ejected/sprayed organic material solution is absorbed onto the pattern areas 13. The developing assembly 30 further includes a reservoir 32 of the organic material solution 60 connected with the pump 31 and a valve 34 connected between the reservoir 32 and the pump 31. The pump 31 is disposed with a sprayer 311 disposed towards the nozzle. It is noted that, the organic material solution 60 is a mixture solution and specifically is that a polymer or small molecule OSC material uniformly is dispersed into an organic solvent. After the valve is switched on, the organic material solution enters into the high-pressure nozzle 33 via the sprayer 311 of the pump 31, the organic material solution 60 then is charged with the third charge (negative charge in the illustrated embodiment) after flowing through the electrode pair 331 and atomized when being sprayed from the high-pressure nozzle 33, so that the organic material solution is atomized into multiple (i.e., more than one) small droplets and ejected onto the pattern areas 13 to form organic pattern areas 16 such as channel regions.

Figure 5:
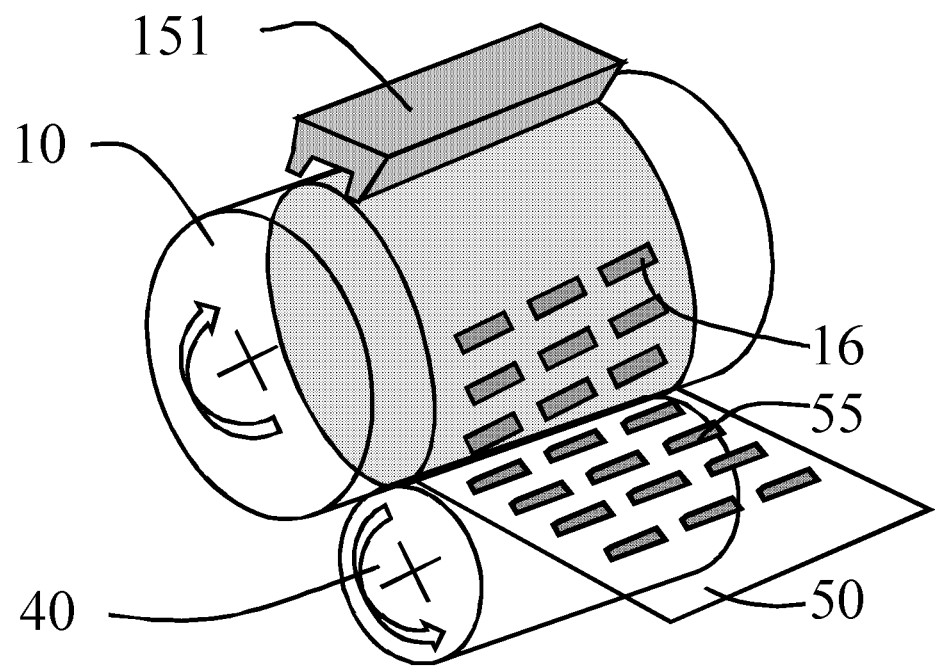
FIG. 5 is a schematic view of the photosensitive roller and a driven roller of the manufacturing apparatus of an organic thin film transistor in FIG. 1.

Referring to FIG. 5, an outer circumferential surface of the driven roller 40 and the photosensitive outer surface 11 of the photosensitive roller 10 are tangent and have opposite rotation directions. The surface of the driven roller 40 has a fourth charge with opposite polarity with respect to the third charge and for charging a thin film transistor flexible substrate wound on the outer circumferential surface of the driven roller. In the illustrated embodiment, the organic pattern areas 16 formed on the pattern areas 13 are transferred to the substrate 50 to form channel regions 55.

Figure 6:
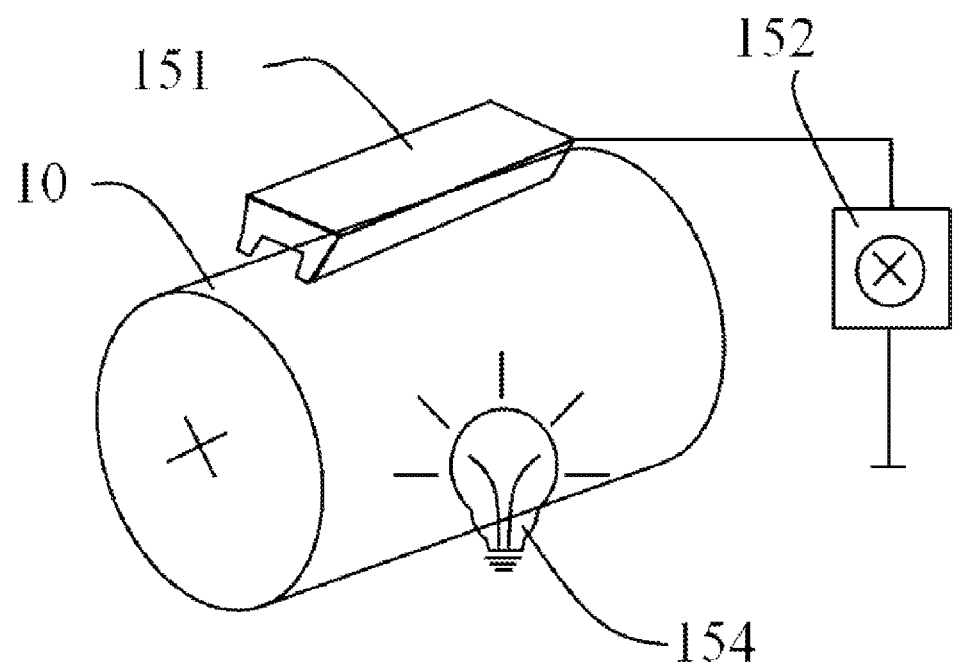
FIG. 6 is a schematic view of the photosensitive roller and the power supply assembly with an exposure light source of the manufacturing apparatus of an organic thin film transistor in FIG. 1.

Referring to FIG. 6, the power supply assembly 15 further includes an exposure light source 154. After the photosensitive roller 10 finishes its work, the exposure light source 54 irradiates the photosensitive outer surface 11 of the photosensitive roller 10 to remove/eliminate residual first charge.

Figure 7:
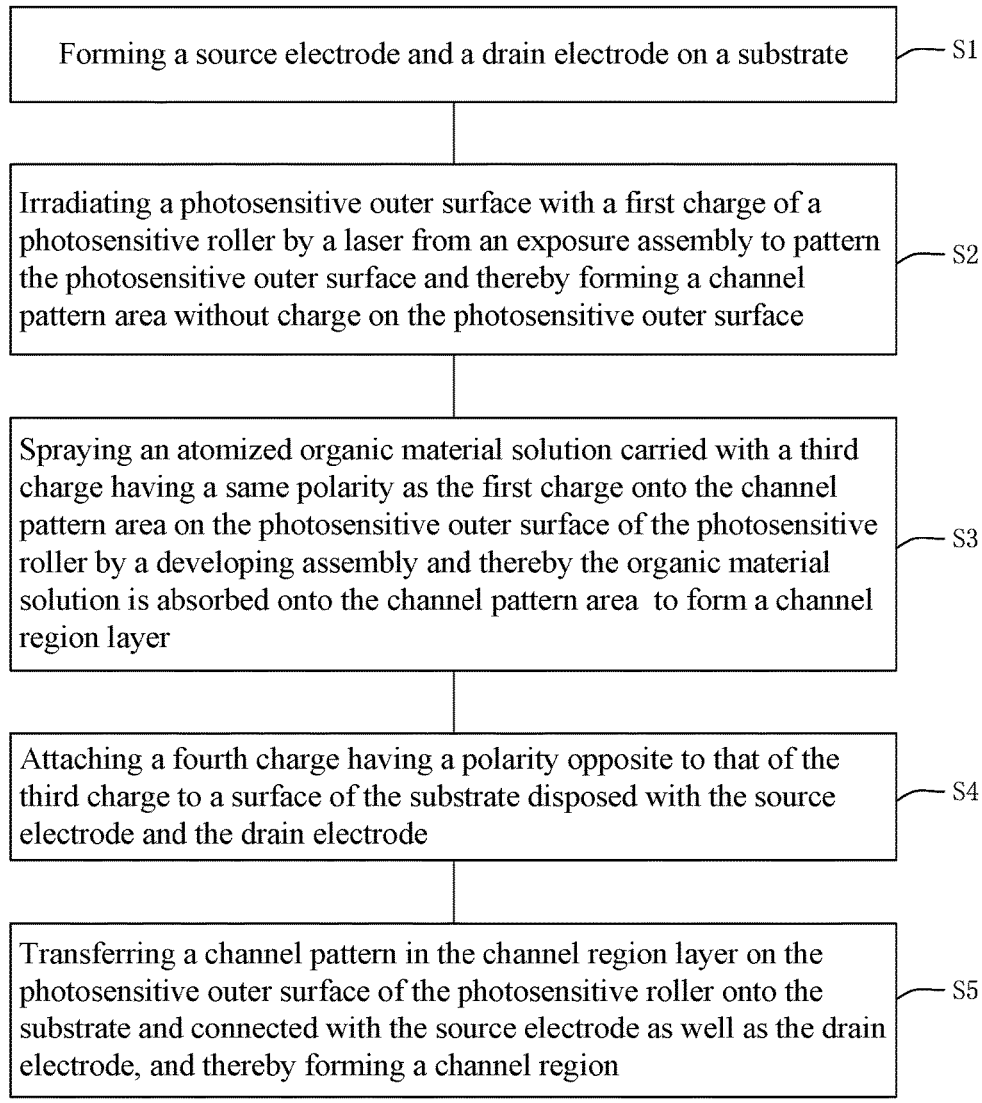
FIG. 7 is a flowchart of a manufacturing method of an organic thin film transistor according to a preferred embodiment of the invention.

Referring to FIG. 7, the invention further provides a manufacturing method of an organic thin film transistor. The manufacturing method includes steps as follows.

Figure 8:
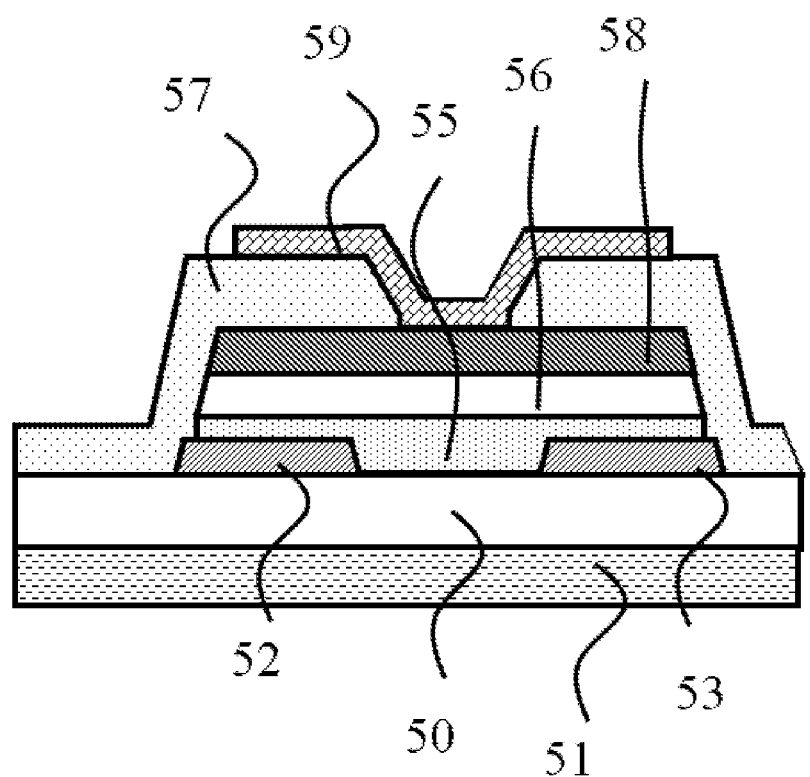
FIG. 8 is a partial cross-sectional view of a thin film transistor formed by the method of FIG. 7.

Step one (S1), as shown in FIG. 8, forming a source electrode 52 and a drain electrode 53 on a substrate 50. The step one further includes forming the substrate 50 on a glass substrate 51 by coating and solidifying. The substrate 50 is a flexible substrate.

Step two (S2), irradiating by a laser of the exposure assembly 20 to pattern the photosensitive outer surface 11 with a first charge of the photosensitive roller 10, to thereby form channel pattern areas 16 without charge on the photosensitive outer surface 11. The un-irradiated portion is still brought with the first charge. The step two may be repeated to form patterns of different areas on a same layer, or form multiple channel region patterns for multiple transistors. Moreover, the step two further includes: charging the photosensitive outer surface of the photosensitive roller 10 by the power supply assembly 15, to make the photosensitive outer surface be uniformly charged with the first charge. In the illustrated embodiment, the first charge is a negative charge, and a second charge inside the photosensitive roller 10 is a positive charge. By the irradiation of laser with graphic information on the photosensitive outer surface with the first charge, the first charge in the irradiated portion and the second charge inside the photosensitive roller are communicated to make the charge in the irradiated portion be removed/disappeared, and therefore the pattern areas without charge, which are channel pattern regions 16 in the illustrated embodiment, are formed.

Step three (S3), spraying an atomized organic material solution carried with a third charge having a same polarity as the first charge on the channel pattern regions 16 of the photosensitive outer surface of the photosensitive roller 10 by the developing assembly 30, to make the organic material solution be absorbed onto the channel pattern regions 16 and thereby form a channel region layer. A thickness of the channel region layer 17 uses nanometer as unit. The organic material solution flows through the pump 31 and enters into the high-pressure nozzle 33 via the sprayer 311, and then the organic material solution is given with a third charge (e.g., a negative charge in the illustrated embodiment) by the electrode pairs 331 and atomized by the high-pressure nozzle 33, so that the organic material solution is atomized into multiple small droplets and then ejected out. Because of the repulsion principle of same polarity of charges, the organic material solution with the third charge and the first charge on the photosensitive outer surface 11 are repelled each other, the small droplets of the organic material solution only are attached to the channel pattern areas 16 without charge and thereby form the channel region layer having the organic material.

Step four (S4), attaching a fourth charge with a polarity opposite to that of the third charge onto a surface of the substrate 50 disposed with the source electrode and the drain electrode. The fourth charge can be firstly applied onto the driven roller by the power supply assembly, and then the substrate 50 is wound on the driven roller 40.

Step five (S5), transferring the channel region layer on the photosensitive outer surface of the photosensitive roller 10 onto the substrate 50 and making the channel region layer be connected with the source and drain electrodes to thereby form a channel region 55. The step mainly includes: sandwiching the substrate between the photosensitive roller and the driven roller and supporting the substrate by the driven roller, and then rotating the photosensitive roller and the driven roller, the organic material solution on the channel region layer of the photosensitive outer surface then is transferred onto the substrate. It can be understood that, in the process of transferring, it may be transferred to the substrate one-time, or sequentially transferred to the substrate according to different or adjacent pattern areas of a pattern, which facilitates to flexibly use the photosensitive roller to perform the transfers of multiple patterns on the prerequisite of that corresponding patterns have been prepared at the time of exposure and development.

Furthermore, the method further includes a step of removing/eliminating residual charge on the surface of the photosensitive roller by exposure. After the photosensitive roller 10 finishes its work, the exposure light source 154 of the power supply assembly 15 irradiates the photosensitive outer surface 11 of the photosensitive roller 10 to remove residual first charge. When repeats the step one through step five again, it will enter into a next period of defining and forming an organic material pattern layer.

The method may still further include a step of forming another organic material layer of the organic thin film transistor on the substrate by the step two through the step five. The another organic material layer may be an organic gate dielectric layer 56 or an organic passivation layer 57 on the channel region 55 on the substrate as shown in FIG. 8. The step specifically is repeating the step two through the step five again and thus will not give detail description. As shown in FIG. 8, a metal layer 58 is formed on the organic gate dielectric layer 56 and the channel region 55, and the organic passivation layer 57 is covered with an electrode layer 59.

The manufacturing method of an organic thin film transistor of the invention adopts a technique similar to "electrophotography" and its method of defining an organic layer pattern based on a solution method is using a laser beam to quickly "project" a digital image onto a surface of a photosensitive roller with uniform charges. A position hit by the laser beam would lead to the occurrence of charge digestion/disappearance phenomenon and thereby form a pattern area as required. Atomized small droplets of charged organic material solution would be absorbed onto the pattern area and then is transferred to the substrate to form a patterned channel region. Such method may define a fine organic channel region and meanwhile avoid the mutual pollution between an organic solution of an organic material and an organic photoresist in the process of "exposure-developing-etching" in the prior art. The ultimate goal is to effectively reduce the complexity of using a vacuum process to manufacture a layer with same function and meanwhile reduce the material cost of various layers on the organic thin film transistor substrate.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing apparatus of an organic thin film transistor, wherein the manufacturing apparatus comprises: a photosensitive roller, an exposure assembly, a developing assembly and a driven roller;

the photosensitive roller comprises a photosensitive outer surface with a first charge and a photosensitive inner surface with a second charge, the first charge and the second charge have opposite polarities;

the exposure assembly is configured for irradiating a laser with graphic information to the photosensitive outer surface and thereby forming a pattern area without charge on the photosensitive outer surface;

the developing assembly comprises a pump for outputting an organic material solution and a high-pressure nozzle with an electrode pairs, the organic material solution ejected from the high-pressure nozzle in operation carries a third charge having a polarity same as that of the first charge and the ejected organic material solution then is absorbed onto the pattern area;

an outer circumferential surface of the driven roller and the photosensitive outer surface of the photosensitive roller are tangent and have opposite rotation directions.

2. The manufacturing apparatus of an organic thin film transistor as claimed in claim 1, wherein the manufacturing apparatus further comprises a power supply assembly; the power supply assembly comprises a charging electrode and a power supply for supplying the charging electrode with current.

3. The manufacturing apparatus of an organic thin film transistor as claimed in claim 2, wherein the exposure assembly comprises a laser tube, a reflector group, a laser modulator and a collimating lens; the reflector group is configured for adjusting a light path of a laser emitted from the laser tube to make the laser enter into the laser modulator, so that the laser is modulated into the laser with the graphic information by a laser modulator driving pulse and then strikes onto the photosensitive outer surface after passing the collimating lens to thereby form the pattern area.

4. The manufacturing apparatus of an organic thin film transistor as claimed in claim 2, wherein the developing assembly further a reservoir of the organic material solution connected with the pump, and the organic material solution in the reservoir enters into the nozzle by the pump and then is charged and atomized for ejection.

5. The manufacturing apparatus of an organic thin film transistor as claimed in claim 2, wherein a surface of the driven roller is given with a fourth charge having a polarity opposite to that of the third charge and for charging a thin film transistor flexible substrate wound on the outer circumferential surface of the driven roller.

6. A manufacturing method of an organic thin film transistor, wherein the manufacturing method comprises:

step one, forming a source electrode and a drain electrode on a substrate;

step two, irradiating a photosensitive outer surface with a first charge of a photosensitive roller by a laser of an exposure assembly to pattern the photosensitive outer surface and thereby forming a channel pattern area without charge on the photosensitive outer surface;

step three, spraying an atomized organic material solution with a third charge having a same polarity as the first charge onto the channel pattern area on the photosensitive outer surface of the photosensitive roller by a developing assembly to make the organic material solution be absorbed onto the channel pattern area and thereby form a channel region layer;

step four, attaching a fourth charge having a polarity opposite to that of the third charge onto a surface of the substrate disposed with the source electrode and the drain electrode step five, transferring a channel pattern in the channel region layer on the photosensitive outer surface of the photosensitive roller onto the substrate and making the channel pattern be connected with the source electrode and the drain electrode, to thereby form a channel region.

7. The manufacturing method of an organic thin film transistor as claimed in claim 6, wherein the step two further comprises: charging the photosensitive outer surface of the photosensitive roller by a power supply assembly to make the photosensitive outer surface be uniformly carried with the first charge.

8. The manufacturing method of an organic thin film transistor as claimed in claim 6, wherein the step two comprises: irradiating the photosensitive outer surface with the first charge by the laser carried with graphic information; wherein the first charge in an irradiated portion and a second charge inside the photosensitive roller are communicated to make the charge in the irradiated portion be disappeared and thereby the channel pattern area without charge is formed.

9. The manufacturing method of an organic thin film transistor as claimed in claim 6, wherein the step three comprises: using a pump and a nozzle to atomize the organic material solution, charge the organic material solution with the third charge and then spray the organic material solution onto the channel pattern area.

10. The manufacturing method of an organic thin film transistor as claimed in claim 6, wherein the step five comprises: sandwiching the substrate between the photosensitive roller and a driven roller and making the substrate be supported by the driven roller and further rotating the photosensitive roller and the driven roller, and thereby the organic material solution on the channel region layer of the photosensitive outer surface is transferred onto the substrate.

11. The manufacturing method of an organic thin film transistor as claimed in claim 6, wherein the manufacturing method further comprises a step of eliminating residual charge on the surface of the photosensitive roller by exposure.

12. The manufacturing method of an organic thin film transistor as claimed in claim 6, wherein the manufacturing method further comprises a step of forming another organic material layer of the organic thin film transistor on the substrate by the step two through the step five.

\* \* \* \* \*